United States Patent [19]
Miyazaki et al.

[11] Patent Number: 5,929,743
[45] Date of Patent: Jul. 27, 1999

[54] MOUNTING STRUCTURE FOR THERMISTOR WITH POSITIVE RESISTANCE-TO-TEMPERATURE CHARACTERISTIC

[75] Inventors: Michio Miyazaki; Haruyuki Takeuchi; Tadao Bekku, all of Ishikawa-ken, Japan

[73] Assignee: Murata Manufacturing Co., Ltd., Kyoto, Japan

[21] Appl. No.: 08/745,888

[22] Filed: Nov. 8, 1996

[30] Foreign Application Priority Data

Nov. 20, 1995 [JP] Japan .................................. 7-300978

[51] Int. Cl.⁶ ...................................................... H01C 7/10
[52] U.S. Cl. ........................... 338/22 R; 338/59; 338/315; 338/322; 338/324; 338/277; 361/768; 361/770
[58] Field of Search ............................. 338/22 R, 22 SD, 338/59, 277, 322, 324, 329, 315; 361/768, 770, 782, 811

[56] References Cited

U.S. PATENT DOCUMENTS

| Re. 35,733 | 2/1998 | Hernandez . | |
|---|---|---|---|
| 3,497,859 | 2/1970 | Bang | 338/309 |
| 4,333,069 | 6/1982 | Worth et al. | 338/315 |
| 4,395,586 | 7/1983 | Eiermann et al. | 174/138 J |
| 4,518,944 | 5/1985 | Faris | 338/22 R |
| 4,833,570 | 5/1989 | Teratani | 361/811 |
| 4,918,573 | 4/1990 | Stavraka et al. | 361/403 |
| 4,991,059 | 2/1991 | Kiyose | 361/773 |
| 5,141,334 | 8/1992 | Castles | 374/178 |
| 5,233,326 | 8/1993 | Motoyoshi | 338/22 R |
| 5,255,159 | 10/1993 | Seyk | 361/770 |
| 5,280,264 | 1/1994 | Yajima et al. | 338/25 |
| 5,289,155 | 2/1994 | Okumura et al. | 338/22 SD |
| 5,291,175 | 3/1994 | Ertmer et al. | 338/59 |
| 5,351,026 | 9/1994 | Kanabara et al. | 338/22 R |
| 5,612,855 | 3/1997 | Heeb et al. | 361/768 |
| 5,726,623 | 3/1998 | Camp | 338/22 R |

FOREIGN PATENT DOCUMENTS

| 94/10876 | 1/1994 | WIPO | 338/22 R |
|---|---|---|---|
| 95/24045 | 9/1995 | WIPO . | |

OTHER PUBLICATIONS

Diss O Pad Brochure (Oct. 1969).

Primary Examiner—Michael L. Gellner
Assistant Examiner—Karl Easthom
Attorney, Agent, or Firm—Majestic, Parsons, Siebert & Hsue P.C.

[57] ABSTRACT

A thermistor with positive resistance-to-temperature characteristic used in a overcurrent protection circuit has electrodes on mutually opposite main surfaces and is mounted to a substrate having electrically conductive members such that deterioration of its voltage resistance due to heat emission can be controlled. A spacer with smaller thermal conductivity than the substrate and penetrated by a conductor piece with a small cross-sectional area is inserted between solder materials connecting to one of the thermistor electrodes. The other electrode is contacted by an elongated connecting member through its sectional surface transverse to its longitudinal direction such that the cross-sectional area of electrical conduction is reduced.

4 Claims, 8 Drawing Sheets

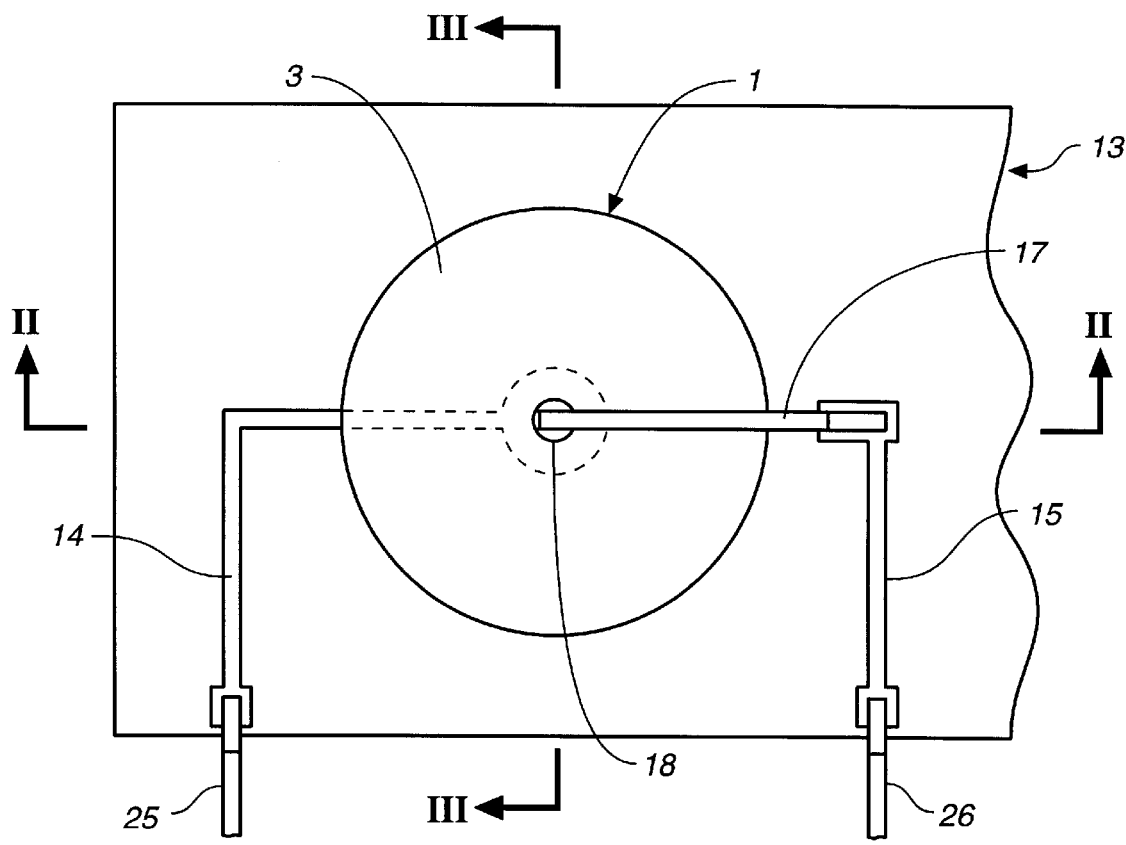
FIG._1
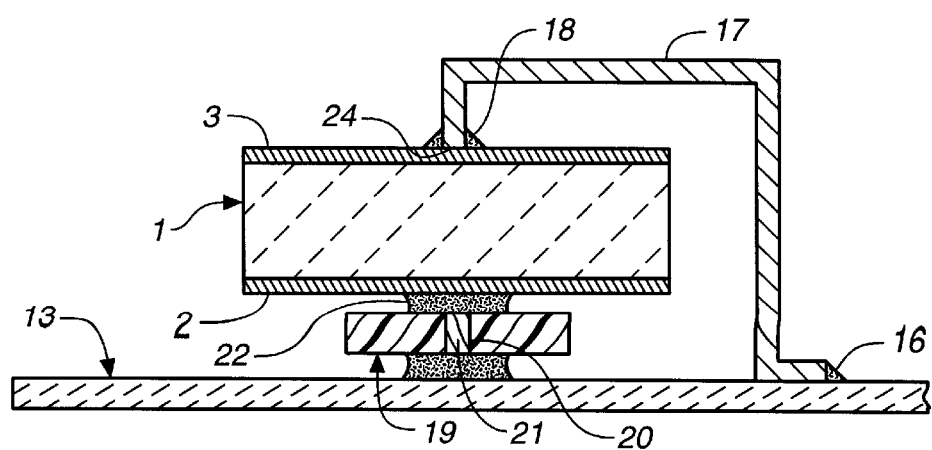
FIG._2

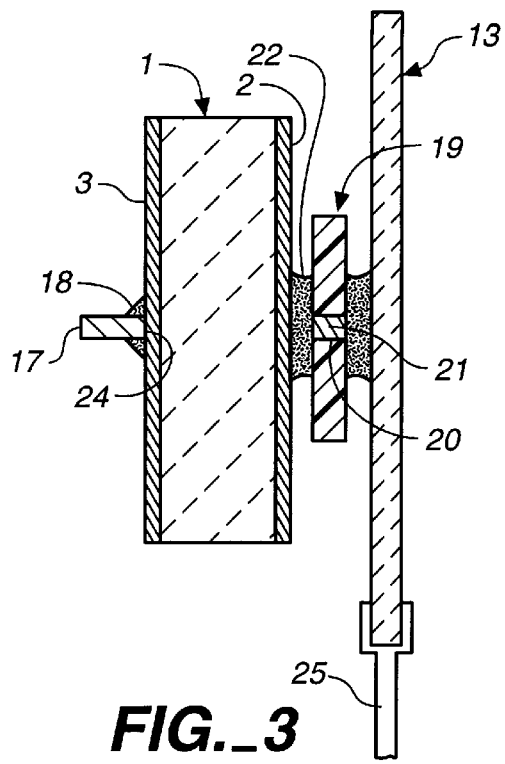
FIG._3
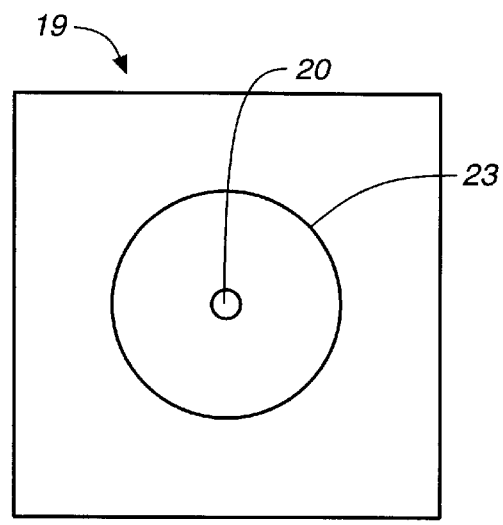
FIG._4
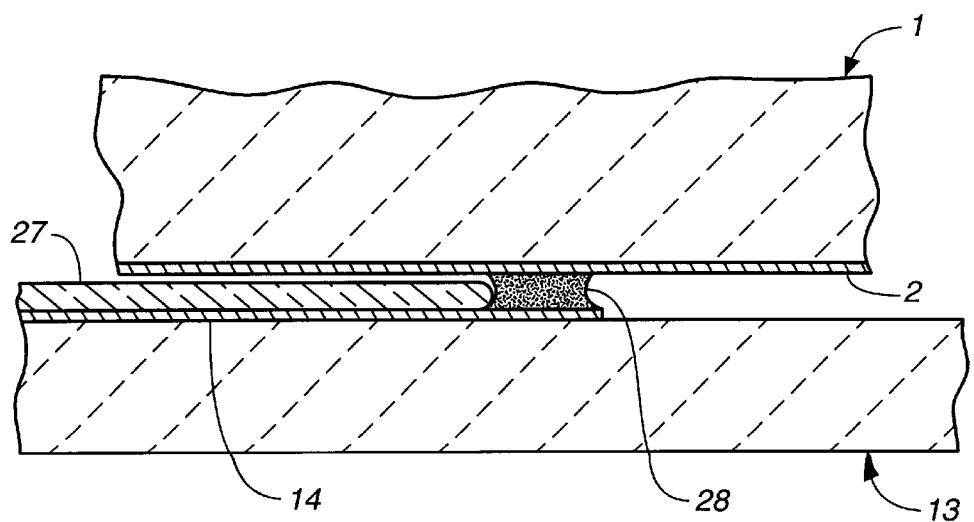
FIG._5

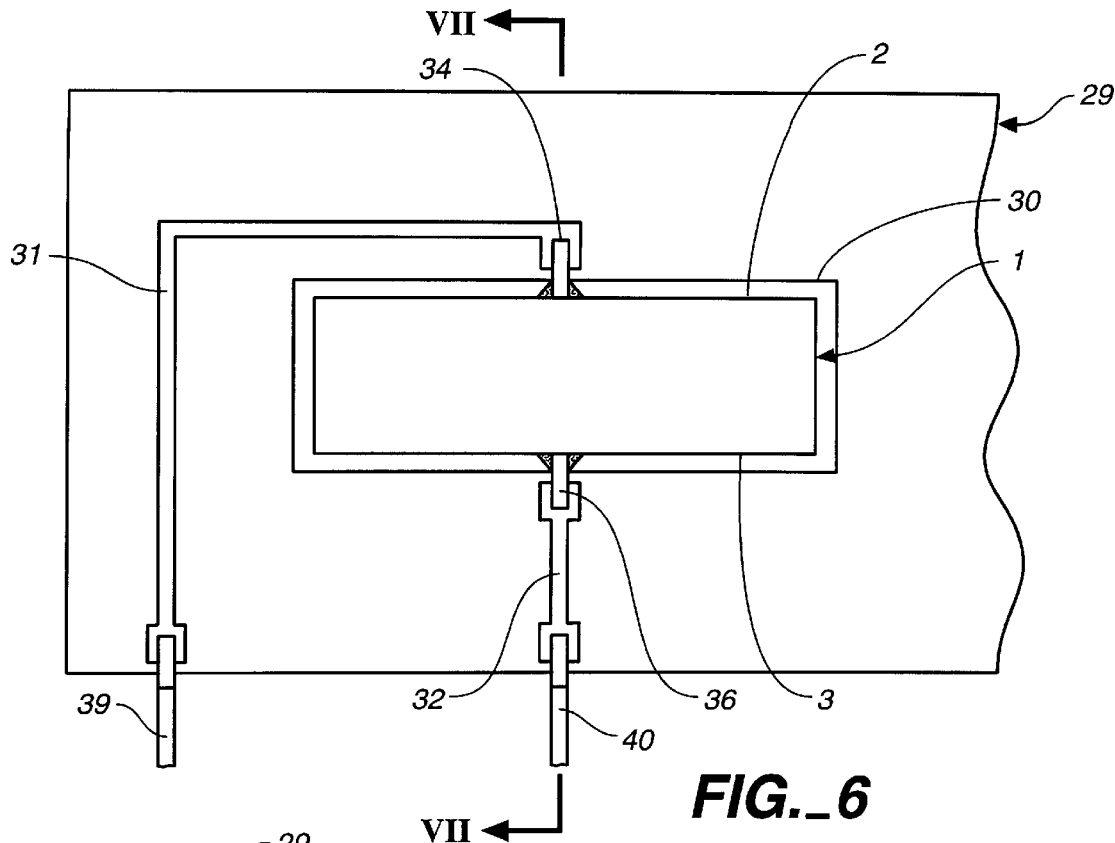
*FIG._6*
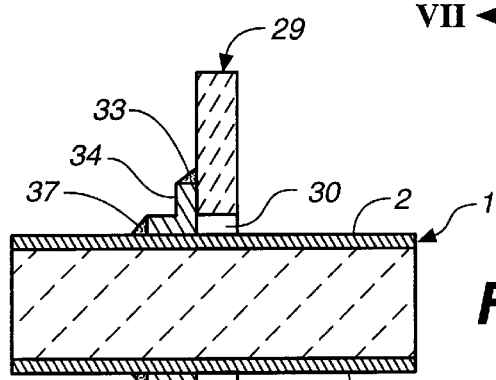
*FIG._7*
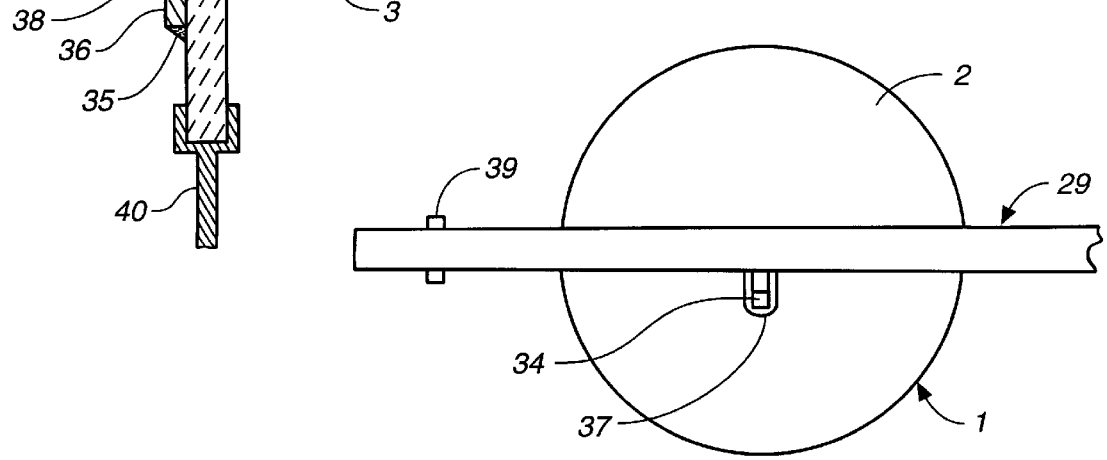
*FIG._8*

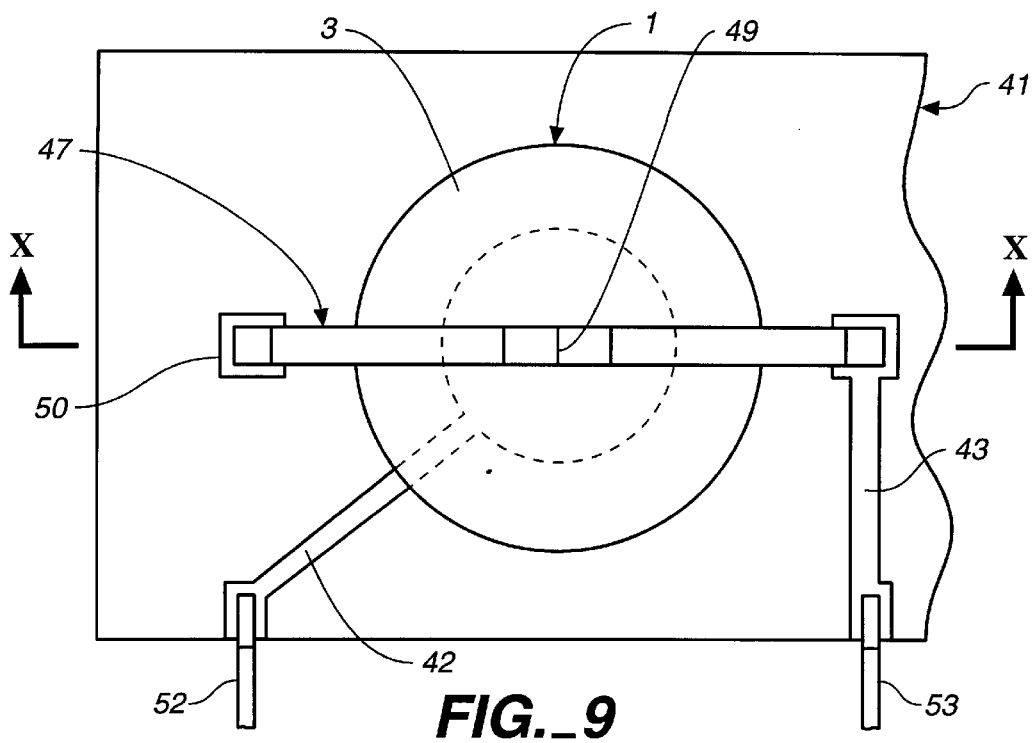
FIG._9
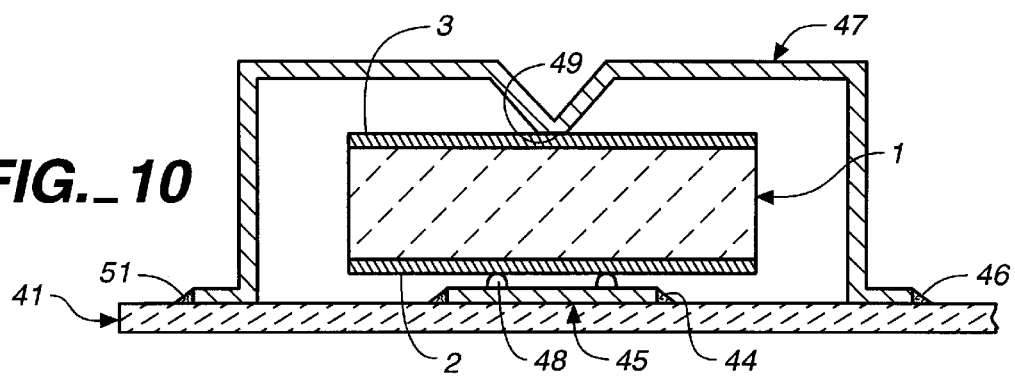
FIG._10
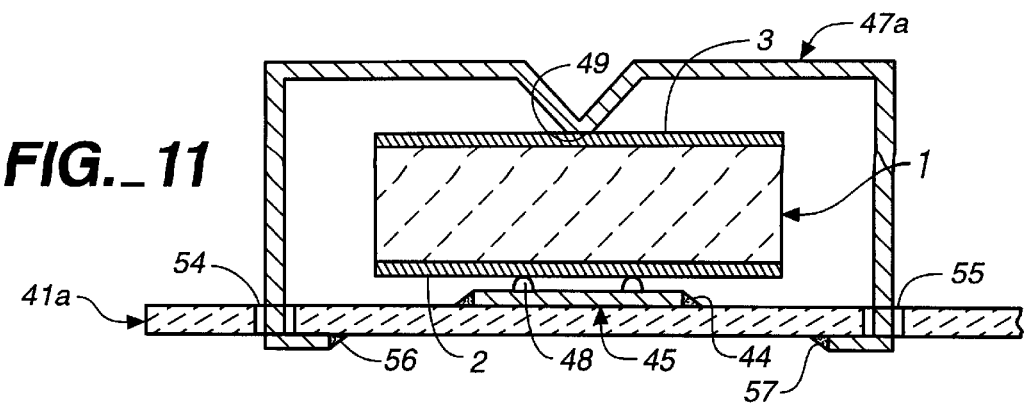
FIG._11

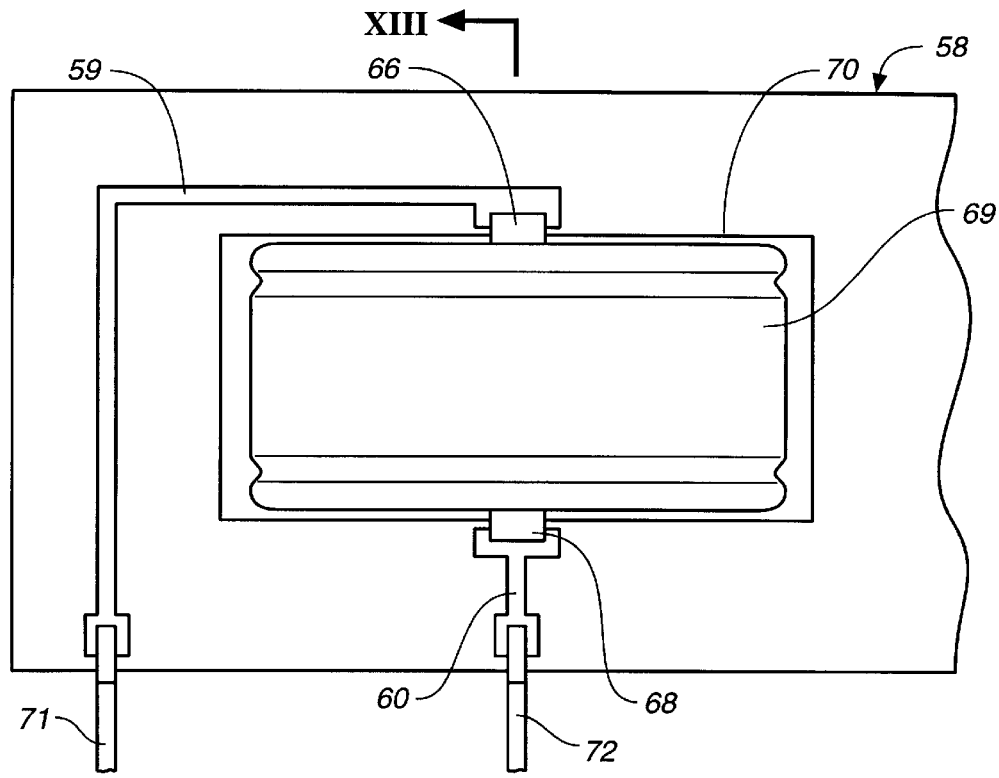
FIG._12
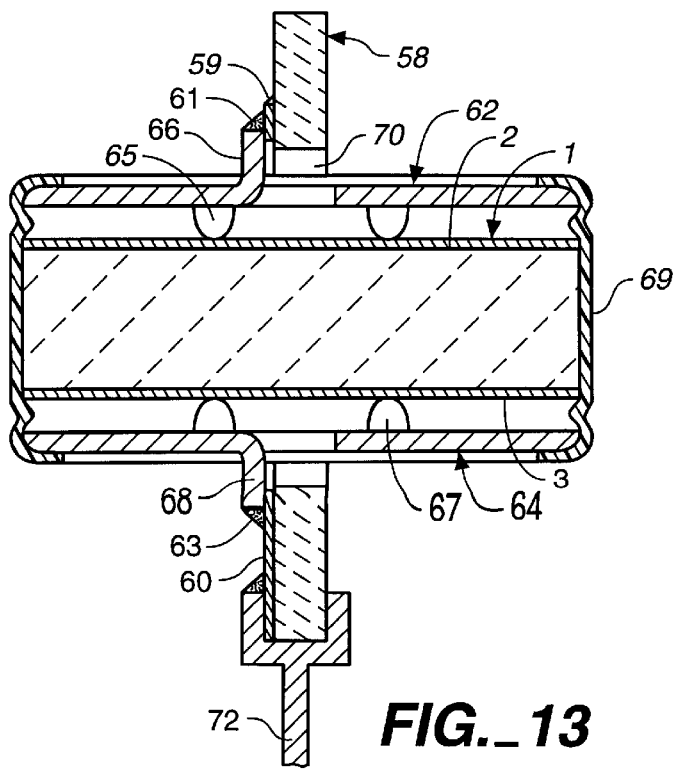
FIG._13

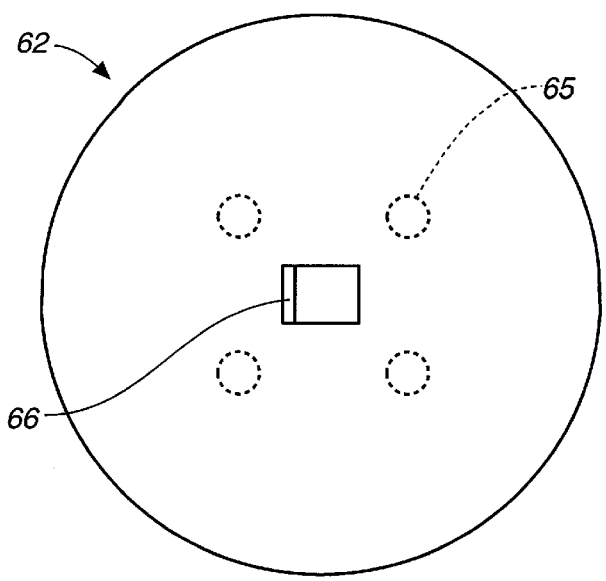
FIG._14
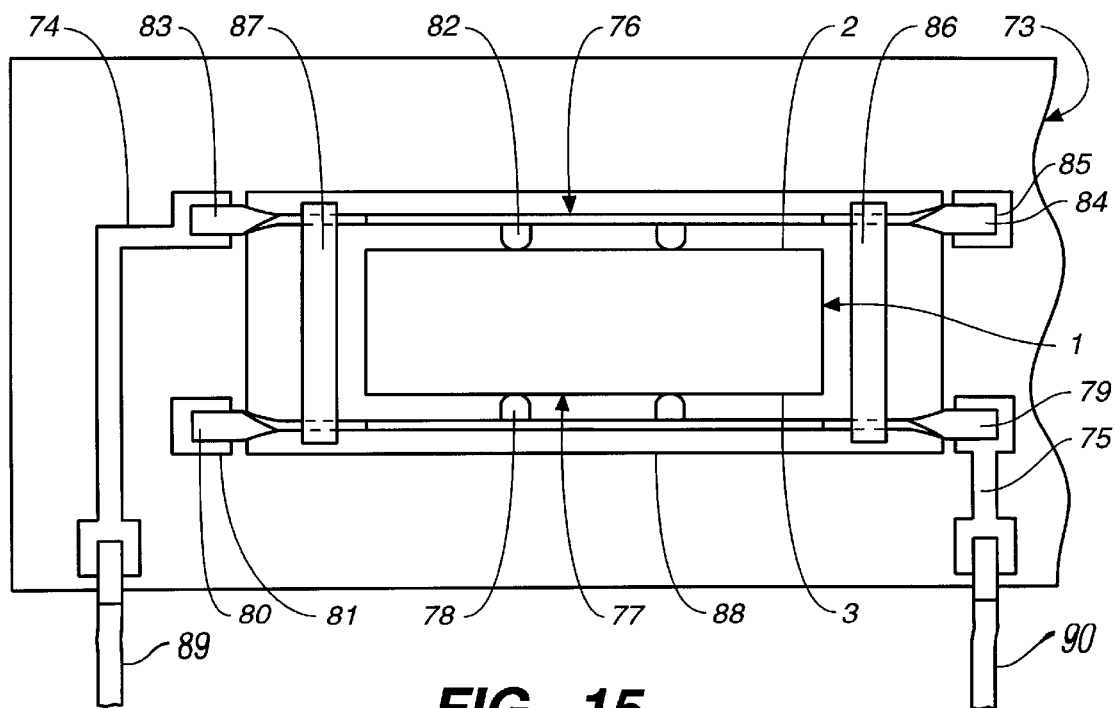
FIG._15

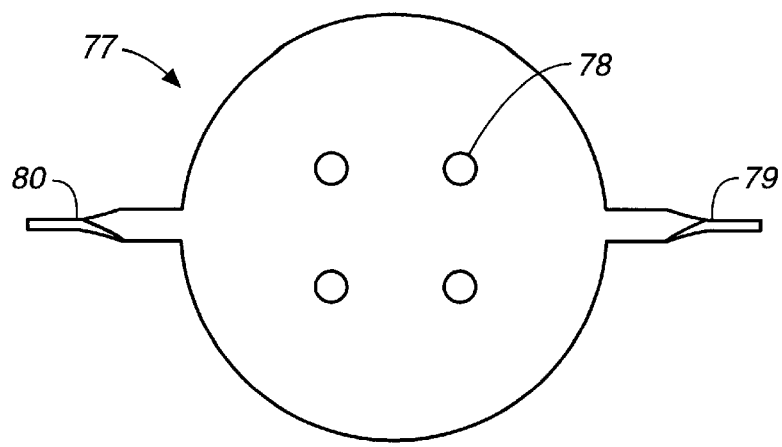
FIG._16
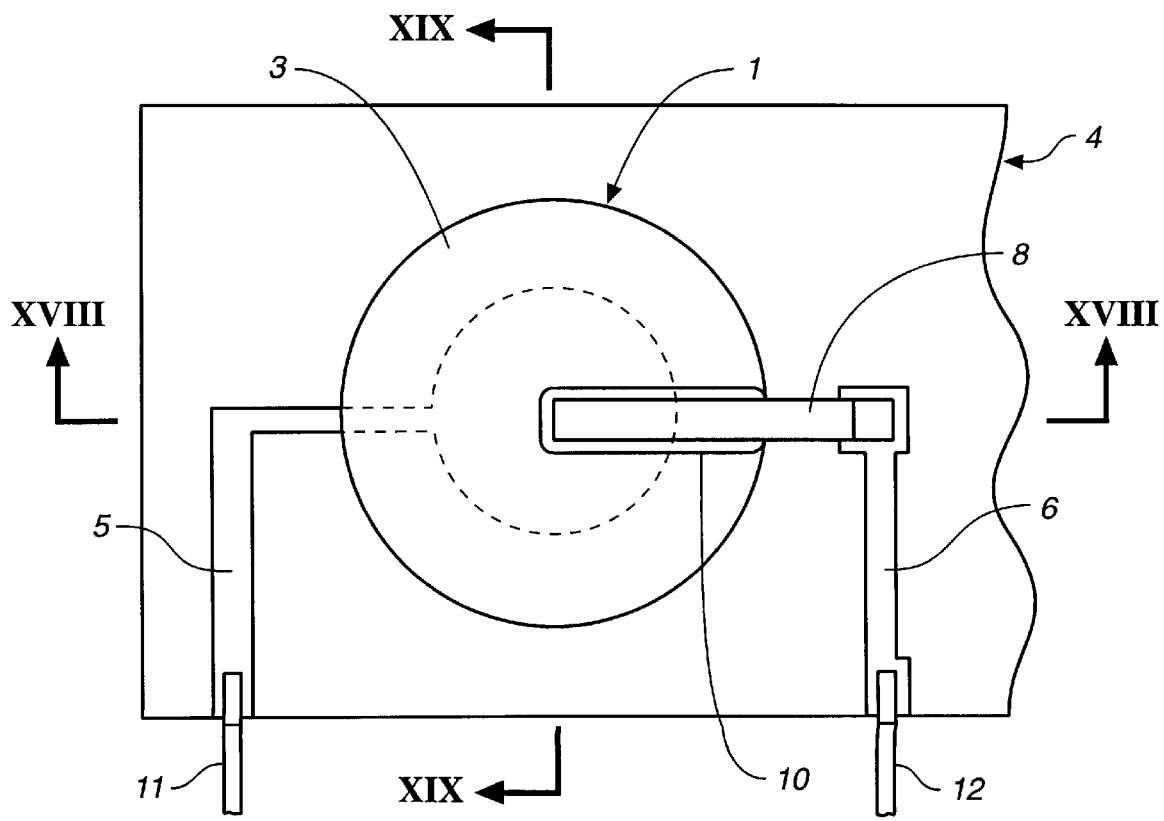
FIG._17
*(PRIOR ART)*

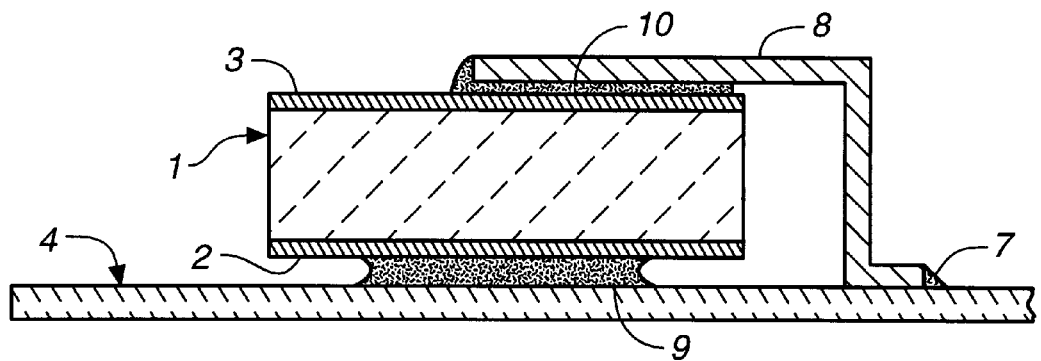
FIG._18
*(PRIOR ART)*
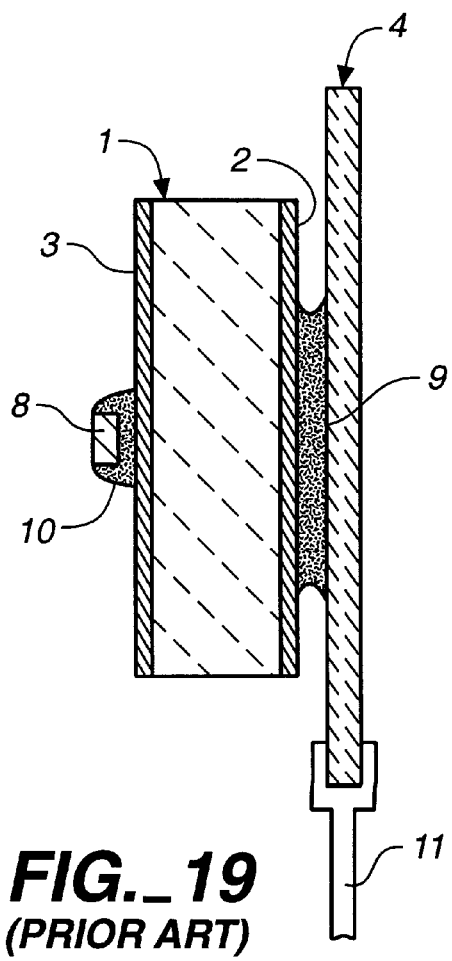
FIG._19
*(PRIOR ART)*

MOUNTING STRUCTURE FOR THERMISTOR WITH POSITIVE RESISTANCE-TO-TEMPERATURE CHARACTERISTIC

BACKGROUND OF THE INVENTION

This invention relates to a structure for mounting a thermistor with positive resistance-to-temperature characteristic. More particularly, this invention relates to thermistors with improved voltage resistance.

Thermistors with positive resistance-to-temperature characteristics (hereinafter referred to simply as the positive characteristic) are used, for example, in overcurrent protection circuits in the telecommunication field. FIGS. 17, 18 and 19 show a prior art structure for mounting a positive characteristic thermistor 1 for such a use, FIG. 17 being a plan view of a portion of a hybrid IC having the thermistor 1 mounted thereto, FIG. 18 being a sectional view taken along line XVIII—XVIII in FIG. 17 and FIG. 19 being a sectional view taken along line XIX—XIX in FIG. 17.

As shown in FIGS. 17–19D the positive characteristic thermistor 1 has electrodes 2 and 3 formed respectively on its mutually opposite main surfaces. This thermistor 1 is mounted to a substrate 4 made, for example, of a ceramic. The substrate 4 has conductive members which are each electrically connected to a corresponding one of electrodes 2 and 3. According to this prior art example, the conductive members include conductive lands 5 and 6 formed on the substrate 4, a connecting member 8 to be connected to the conductive land 6 through solder 7, a solder part 9 provided so as to electrically connect the conductive land 5 and the electrode 2, and another solder part 10 for electrically connecting the connecting member 8 and the electrode 3. Lead terminals 11 and 12 are also attached to the substrate 4 for electrically connecting to the conductive lands 5 and 6, respectively.

The resistance against voltage by a thermistor 1 thus structured sometimes deteriorates, depending upon how it is mounted, compared to before it is mounted. This is because the escape of heat from the ceramic substrate 4 is relatively high such that, when the electric energy applied to the thermistor 1 is converted into heat, a large portion of this heat energy escapes through the solder parts 7, 9 and 10, as well as the connecting member 8, thereby increasing the heat flow from the thermistor 1 and destroying its balance.

SUMMARY OF THE INVENTION

It is therefore an object of this invention to provide an improved mounting structure for a thermistor with positive characteristic capable of preventing the deterioration of its voltage resistance.

This invention relates to a structure for mounting a thermistor with positive characteristic having electrodes on mutually opposite main surfaces to a substrate with electrically conductive members to which the electrodes are to be electrically connected. In order to attain the above and other objects, the structure comprises means for restraining heat conduction from the thermistor to the electrical conductor, characterized by a small cross-sectional area for electrical conduction.

In examples wherein the electrically conducting members comprise electrically conductive lands soldered to the electrodes for electrically connecting, the conduction-restraining means comprises a spacer which is made of a material with lower thermal conductivity than the substrate and disposed between a conductive land and an electrode and the portion of the conductive member with reduced cross-sectional area penetrates this spacer. According to another embodiment of the invention, a portion of the conductive land is covered with a non-metallic material such that the area on which solder is applied can be limited. According to still another embodiment of the invention, the portion of the conductive member with reduced cross-sectional area is realized by means of a chip-like connecting member soldered to the electrode.

The electrically conductive members of this invention may be disposed opposite to the electrodes and provided with protrusions that contact the electrodes such that these protrusions can function as narrowed contacting parts with reduced cross-sectional area.

If the thermistor is disposed such that one of its electrodes faces the substrate, the part of one of the electrically conductive members contacting the other of the electrodes may be formed with a cross-sectional surface transverse to the longitudinal direction of the conductive member so as to reduce the area of contact to the electrode. Alternatively, the conductive member may be bent such that the bent edge serves to contact the electrode.

According to this invention, a means for restraining thermal conduction, including cross-sectionally narrowed portion, is provided near or at the position of contact between an electrode on the thermistor and an electrically conductive member on the substrate such that emission of heat from the thermistor can be controlled. Deterioration of voltage resistance can thus be controlled when a thermistor is mounted to a substrate.

BRIEF DESCRIPTION OF THE DRAWINGS

The accompanying drawings, which are incorporated in and form a part of this specification, illustrate embodiments of the invention and, together with the description, serve to explain the principles of the invention. In the drawings:

FIG. 1 is a plan view of a portion of a hybrid IC having a thermistor mounted according to a first embodiment of this invention;

FIG. 2 is a sectional view taken along line II—II of FIG. 1;

FIG. 3 is a sectional view taken along line III—III of FIG. 1;

FIG. 4 is a plan view of the spacer shown in FIG. 2;

FIG. 5 is a sectional view of a portion of another hybrid IC having a thermistor mounted according to a second embodiment of this invention;

FIG. 6 is a front view of a portion of still another hybrid IC having a thermistor mounted according to a third embodiment of this invention;

FIG. 7 is a sectional view taken along line VII—VII of FIG. 6;

FIG. 8 is a plan view of the hybrid IC of FIG. 6;

FIG. 9 is a plan view of a portion of still another hybrid IC having a thermistor mounted according to a fourth embodiment of this invention;

FIG. 10 is a sectional view taken along line X—X of FIG. 9;

FIG. 11 is a sectional view of a portion of still another hybrid IC having a thermistor mounted according to a fifth embodiment of this invention FIG. 12 is a front view of a portion of still another hybrid IC having a thermistor mounted according to a sixth embodiment of this invention;

FIG. 13 is a sectional view taken along line XIII—XIII of FIG. 12;

FIG. 14 is a plan view of the conductive plate shown in FIG. 13;

FIG. 15 is a front view of a portion of still another hybrid IC having a thermistor mounted according to a seventh embodiment of this invention;

FIG. 16 is a plan view of the conductive plate shown in FIG. 15;

FIG. 17 is a plan view of a portion of a prior art hybrid IC having a thermistor mounted thereto;

FIG. 18 is a sectional view taken along line XVIII—XVIII of FIG. 17; and

FIG. 19 is a sectional view taken along line XIX—XIX of FIG. 17.

Throughout herein, components which are equivalent or substantially alike are indicated by the same numerals and are not repetitively described.

DETAILED DESCRIPTION OF THE INVENTION

FIGS. 1–4 are for describing a structure according to a first embodiment of this invention for mounting the thermistor 1 with positive characteristic, FIG. 1 being a plan view of a portion of a hybrid IC having the thermistor 1 mounted thereto, FIG. 2 being a sectional view taken along line II—II of FIG. 1, and FIG. 3 being a sectional view taken along III—III of FIG. 1. The thermistor 1 shown in FIGS. 1–3 is identical to the thermistor shown in FIGS. 17–19, having electrodes 2 and 3 each formed on a corresponding one of its mutually opposite main surfaces. Although the electrodes 2 and 3 are each shown as entirely covering the corresponding main surface, it is preferable to have a two-layer structure with an electrode mainly of Ni as the lower layer and another electrode mainly of Ag as the upper layer, the upper layer being formed with gaps left on the edges of the lower layer so as to expose the nickel of the lower layer.

The thermistor 1 is mounted, for example, to a ceramic substrate 13 having conductive members respectively connected to the electrodes 2 and 3. According to this embodiment, the conductive members include conductive lands 14 and 15 formed on the substrate 13, a connecting member 17 connected to the conductive land 15 through solder 16, a solder part 18 electrically connecting the connecting member 17 with the electrode 3, a penetrating conductor 20 formed through a spacer 19 positioned between the conductive land 14 and the electrode 2, and solder portions 21 and 22 electrically connecting the penetrating conductor 20 with the conductive land 14 and the electrode 2. The spacer 19 is made of a material which is thermally less conductive than the ceramic substrate 13 such as a fluorine resin like polytetra-fluoroethylene, an imide resin like bis-maleimide triazine or an imide resin like polyimide. As shown in FIG. 4, the spacer 19 has on its main surface a solder-providing area 23, a similar solder-providing area (not shown) being also formed on the other main surface. These solder-providing areas 23 are electrically connected to each other through the penetrating conductor 20.

The solder portions 21 and 22 are each provided to the corresponding one of the solder-providing areas 23 such that the thermistor 1 is attached to the substrate 13 through the spacer 19. It is to be noted that the sectional area of the penetrating conductor 20 through the spacer 19 is smaller than not only the area of the electrode 2 but also the sectional areas of the solder portions 21 and 22. Thus, emission of heat from the electrode 2 can be advantageously controlled not only by the low thermal conductivity of the space 19 itself but also the small sectional area of the penetrating conductor 20 near the electrode 2.

The connecting member 17 contacts the electrode 3 on the thermistor 1 over a sectional surface 24 transverse to its longitudinal direction, or more specifically in a perpendicular direction. In other words, a part with a reduced cross-sectional area is formed at the contact with the electrode 3 and the application area for the solder part 18 can also be reduced. Flow of heat from the electrode 3 can thus be effectively controlled.

Lead terminals 25 and 26 are attached to the substrate 13 so as to be electrically connected to the conductive lands 14 and 15, as explained with reference to FIGS. 17–19.

FIG. 5 is for describing another mounting structure according to a second embodiment of this invention for the thermistor 1, corresponding to an enlarged portion of FIG. 2. In FIG. 5, components which correspond to any shown in FIGS. 1–3 are indicated by the same numerals and are not repetitively described.

The second embodiment is characterized as not using a spacer. Use is made of a membrane 27 of a non-metallic material such as a glass glaze such that the area for solder 28 for electrically connecting the electrode 2 with the conductive land 14 can be limited and the sectional area of the solder 28 as conductive member can be reduced. In other respects, the structure is essentially as described above with reference to FIGS. 1–3.

FIGS. 6–8 show a third embodiment of this invention, FIG. 6 being a front view of a portion of a hybrid IC having the thermistor 1 mounted thereto, FIG. 7 being a sectional view taken along line VII—VII in FIG. 6 and FIG. 8 being a plan view of the hybrid IC of FIG. 6.

As shown in FIGS. 6–8, a throughhole 30 is formed through a substrate 29 which may be of a ceramic material, and the thermistor 1 is mounted to the substrate 29 by being accepted inside this throughhole 30. The substrate 29 has conductive members individually connected electrically to the electrodes 2 and 3. The conductive members, according to the third embodiment of this invention, include conductive lands 31 and 32 formed on the substrate 29, a chip-like connecting member 34 connected to the conductive land 31 through solder 33, another chip-like connecting member 36 connected to the conductive land 32 through solder 35, a solder part 37 applied so as to electrically connect a connecting member 34 to the electrode 2 and another solder part 38 applied so as to electrically connect another connecting member 36 to the electrode 3. It is to be noted in this embodiment that sectional areas of the connecting members 34 and 36 are significantly smaller than the electrodes 2 and 3 and accordingly that the sectional areas of the solder parts 37 and 38 are also significantly smaller than the electrodes 2 and 3. As a result, the flow of heat from the electrodes 2 and 3 can be effectively controlled because the sectional areas of connecting members 34 and 36 in contact therewith are small.

Lead terminals 39 and 40 are attached to the substrate 29 so as to be electrically connected to the conductive lands 31 and 32, as shown in the first embodiment of the invention described above with reference to FIGS. 1–3.

In order to compare the voltage resistance against an instantaneous overcurrent between the thermistor 1 mounted according to the first through third embodiments of the invention described above and the thermistor mounted according to FIGS. 17–19, measurements were made as follows with certain selected samples First, thermistors with positive characteristics with diameter 8.3 mm, thickness 3.0 mm, resistance 15Ω and Curie point 90° C. were prepared. Tested on ten samples without mounting, the smallest, largest and average voltage resistances were 560V, 710V and 615V. The same thermistors were then mounted according to FIGS. 17–19. Tested similarly on ten samples, the smallest, largest and average voltage resistances were 360V, 500V and 427V. Tested on ten thermistors mounted according to the first embodiment of the invention, the smallest, largest and average voltage resistances were 450V, 630V and 510V. Tested on ten thermistors mounted according to the second embodiment of the invention, they were 400V, 630V and 503V. Tested on ten thermistors mounted according to the third embodiment of the invention, they were 400V, 630V and 532V. This clearly shows that the degeneration of voltage resistance can be controlled according to the first through third embodiments of this invention.

FIGS. 9 and 10 show still another way of mounting the thermistor 1 according to a fourth embodiment of the invention, FIG. 9 being a plan view of a hybrid IC having the thermistor 1 mounted thereto and FIG. 10 being a sectional view taken along line X—X of FIG. 9.

FIGS. 9 and 10 show a thermistor 1 mounted to a substrate 41 which, for example, may comprise a ceramic material, having conductive members connected individually to the electrodes 2 and 3. According to this embodiment of the invention, the conductive members include conductive lands 42 and 43 formed on the substrate 41, a conductive plate 45 disposed opposite to the electrode 2 and connected to the conductive land 42 through solder 44, and a connecting member 47 connected to the conductive land 43 through solder 46 so as to be conductively contacting the electrode 3. The conductive plate 45 has a plurality of protrusions 48 which contact the electrode 2. It is to be noted that the sectional area of the protrusions 48 is substantially smaller than the area of the electrode 2. Thus, emission of heat from the electrode 2 can be effectively controlled. For this reason, the protrusions 48 are preferably spherical or conical in shape such that their contacts with the electrode 2 are as close to point contacts as possible.

The connecting member 47 is made of a metallic plate which is bent such that its ridge 49 contacts the electrode 3. Thus, its area of contact with the electrode 3 is also very small such that heat emitted from the electrode 3 can be effectively controlled. According to this embodiment, the connecting member 47 is formed like a bridge with one leg attached to the conductive land 43 through solder 46 and the other leg attached to the conductor land 50 on the substrate 41 through solder 51. It is preferable that the connecting member 47 be made of an elastic material such that its ridge 49 is elastically compressed against the electrode 3 and the protrusions 48 will correspondingly contact the electrode 2 like a spring.

Lead terminals 52 and 53 are attached to the substrate 41, as with the first embodiment of the invention shown in FIGS. 1–2, so as to be electrically connected to the conductive lands 42 and 43.

FIG. 11 is for showing the mounting of the thermistor 1 according to a fifth embodiment of the invention, corresponding to FIG. 10. In FIG. 11, components which correspond to those described above with reference to FIGS. 9 and 10 are indicated by the same numerals and are not repetitively explained.

The fifth embodiment of the invention is characterized in that the leg parts of the connecting member 47a each penetrate a corresponding one of throughholes 54 and 55 and are attached to conductive lands (not shown) on the bottom surface of the substrate 41a through solder parts 56 and 57. In other respects, the fifth embodiment is similar to the embodiment shown in FIGS. 9 and 10.

FIGS. 12–14 describe the mounting of the thermistor 1 with positive characteristic according to a sixth embodiment of the inventions FIG. 12 being a front view of a portion of a hybrid IC to which the thermistor 1 is mounted and FIG. 13 being an enlarged sectional view taken along line XIII—XIII of FIG. 12.

FIGS. 12 and 13 show a substrate 58, which may be made of a ceramic material and has conductive members for electrically connected to the electrodes 2 and 3 of the thermistor to be mounted thereto. According to the sixth embodiment of the invention, the conductive members include conductive lands 59 and 60 formed on the substrate 58, a conductive plate 62 disposed opposite to the electrode 2 and connected to the conductive land 59 through solder 61, and another conductive plate 64 disposed opposite to the electrode 3 and connected to the conductive land 60 through solder 63.

As shown in FIG. 14, the conductive plate 62 has a plurality of (such as four) protrusions 65 contacting the electrode 2 and an elongated piece preferred to as the tongue) 66 serving as a contact piece to the conductive land 59 through solder 61. The other conductive plate 64, too, has a plurality of protrusions 67 and a tongue 68. It is to be noted here that the sectional areas of these protrusions 65 and 67 are significantly smaller than the area of the electrodes 2 and 3. Thus, emission of heat from the electrodes 2 and 3 is effectively controlled. For this reason, it is preferred that these protrusions 65 and 67 contact the electrodes 2 and 3 as closely to point contacts as possible. For example, they may preferably be spherical or conical in shape.

According to this embodiment of the invention, the thermistor 1 and the conductive plates 62 and 64 are integrated by a thermally contracting tube 69 surrounding their circumferential surfaces and inserted into a throughhole 70 through the substrate 58. The conductive plates 62 and 64 are compressed respectively towards the electrodes 2 and 3 of the thermistor 1 by the operation of this thermally contracting tube 69 such that the protrusions 65 and 67 securely contact the electrodes 2 and 3.

Lead terminals 71 and 72 are attached to the substrate 58 so as to be electrically connected respectively to the conductive lands 59 and 60, as described above with reference to FIGS. 1–3.

FIGS. 15 and 16 describe the thermistor 1 with positive characteristic mounted according to a seventh embodiment of this inventions FIG. 15 being a front view of a portion of a hybrid IC to which is mounted the thermistor 1.

FIG. 15 shows a substrate 73, which may be of a ceramic material, having conductive members for being electrically connected to the electrodes 2 and 3 of the thermistor 1 to be mounted. According to the seventh embodiment of the invention, the conductive members include conductive lands 74 and 75 formed on the substrate 73, a conductive plate 76 disposed opposite to the electrode 2 and connected to the conductive land 74 through solder (not shown), and another conductive plate 77 disposed opposite to the electrode 3 and connected to the conductive land 75 through solder (not shown). As shown more clearly in FIG. 16, the conductive plate 77 has a plurality of (such as four) protrusions 78 for contacting the electrode 3 and an elongated piece 79 referred to as the tongue for applying solder against the conductive land 75. Another tongue 80 is formed opposite to the first tongue 79 adapted to be attached by soldering to a conductive land 81 formed on the substrate 73. Both tongues 79 and 80 are twisted in the middle by 90° such that soldering of the tongue 79 and 80 to the conductive lands 75 and 81 can be effected over larger areas.

The conductive plate 76 is also provided with a plurality of protrusions 82 and tongues 83 and 84, and another conductive land 85 is provided on the substrate 73 for attaching the tongue 84 by soldering.

It is to be noted that the sectional areas of the protrusions 78 and 82 on the conductive plates 76 and 77 are significantly smaller than the areas of the electrodes 2 and 3. Thus, emission of heat from the electrodes 2 and 3 is effectively controlled. For this purpose, it is preferred that the protrusions 78 and 82 be spherical or conical in shape such that their contacts to the electrodes 2 and 3 are nearly point contacts.

The thermistor 1 and the conductive plates 76 and 77 according to this embodiment of the invention are unitized by means of tubes 86 and 87 which contract with heat, each wound around one of the tongues 79 and 80 and corresponding one of the tongues 84 and 83 of the two conductive plates 76 and 77, and inserted into a throughhole 88 formed through the substrate 73. These conductive plates 76 and 77 are pressed respectively towards the electrodes 2 and 3 of the thermistor 1 by the action of these tubes 86 and 87, causing the protrusions 82 and 78 to dependably contact the electrodes 2 and 3, respectively.

Lead terminals 89 and 90 are provided to the substrate 73 so as to be electrically connected respectively to the conductive lands 74 and 75, as described above with reference to FIGS. 1–3.

What is claimed is:

1. A structure comprising:

a substrate;

a thermistor mounted to said substrate, having two mutually opposite main surfaces and electrodes which are each on a corresponding one of said main surfaces;

an electrically conductive connecting member connecting said substrate with one of said electrodes;

a spacer made of a thermally less conductive material than said substrate and having a penetrating conductor penetrating through said spacer; and solder portions deposited on opposite sides of said spacer and electrically connecting the other of said electrodes with said penetrating conductor and said penetrating conductor with said substrate, said penetrating conductor having a smaller sectional area than said solder portions so as to constrain flow of heat through said solder portions.

2. The structure of claim 1 wherein said connecting member is elongated in a longitudinal direction and having a sectional surface transverse to said longitudinal direction, said connecting member contacting said one electrode over said sectional surface.

3. The structure of claim 1 wherein said spacer comprises a fluorine resin.

4. The structure of claim 1 farther comprising conductive lands disposed on said substrate, said connecting member being connected to one of said conductive lands, one of said solder portions being connected to the other of said conductive lands.

* * * * *